United States Patent
Pedder

Patent Number: 6,005,466
Date of Patent: *Dec. 21, 1999

[54] TRIMMABLE INDUCTOR STRUCTURE

[75] Inventor: David John Pedder, Warwickshire, United Kingdom

[73] Assignee: Mitel Semiconductor Limited, United Kingdom

[*] Notice: This patent issued on a continued prosecution application filed under 37 CFR 1.53(d), and is subject to the twenty year patent term provisions of 35 U.S.C. 154(a)(2).

[21] Appl. No.: 08/506,317

[22] Filed: Jul. 24, 1995

[30] Foreign Application Priority Data

Jul. 29, 1994 [GB] United Kingdom .................... 9415315

[51] Int. Cl.$^6$ ........................................ H01F 5/00
[52] U.S. Cl. ........................ 336/200; 336/223; 336/232
[58] Field of Search .................... 336/180, 200, 336/223, 232; 365/51; 357/72; 29/841; 174/255

[56] References Cited

U.S. PATENT DOCUMENTS

| | | |
|---|---|---|
| 4,494,100 | 1/1985 | Stengel et al. .......................... 336/200 |
| 4,905,358 | 3/1990 | Einbinder ............................... 336/200 |
| 5,239,289 | 8/1993 | Ferraiolo et al. ...................... 336/180 |
| 5,255,431 | 10/1993 | Burdick ..................................... 29/840 |
| 5,502,667 | 3/1996 | Bertin et al. ............................. 365/51 |
| 5,534,837 | 7/1996 | Brandt ..................................... 336/155 |
| 5,747,870 | 5/1998 | Pedder ..................................... 257/531 |

FOREIGN PATENT DOCUMENTS

| | | |
|---|---|---|
| 0 398 485 A1 | 11/1990 | European Pat. Off. . |
| 0 529 503 A1 | 3/1993 | European Pat. Off. . |
| 0 551 735 A1 | 7/1993 | European Pat. Off. ............... 336/192 |
| 58196005 | 11/1983 | Japan ..................................... 336/200 |
| 63116410 | 5/1988 | Japan ..................................... 336/200 |
| 1173702 | 7/1989 | Japan ..................................... 336/200 |
| 2205309 | 8/1990 | Japan ..................................... 336/172 |
| 2 079 066 | 1/1982 | United Kingdom ................... 336/200 |

Primary Examiner—Michael L. Gellner
Assistant Examiner—Anh Mai
Attorney, Agent, or Firm—Kirchstein, et al.

[57] ABSTRACT

To provide trimmable inductor structure for a multichip module, direct-chip-attach or surface mount assembly in which an inductive element is formed on or near a surface of the assembly, a planar chip of dielectric or ferrite material is mounted over the inductive element, this chip having on its upper surface a trimmable metallization layer, which may for example be patterned in concentric rings or in a spiral.

12 Claims, 2 Drawing Sheets

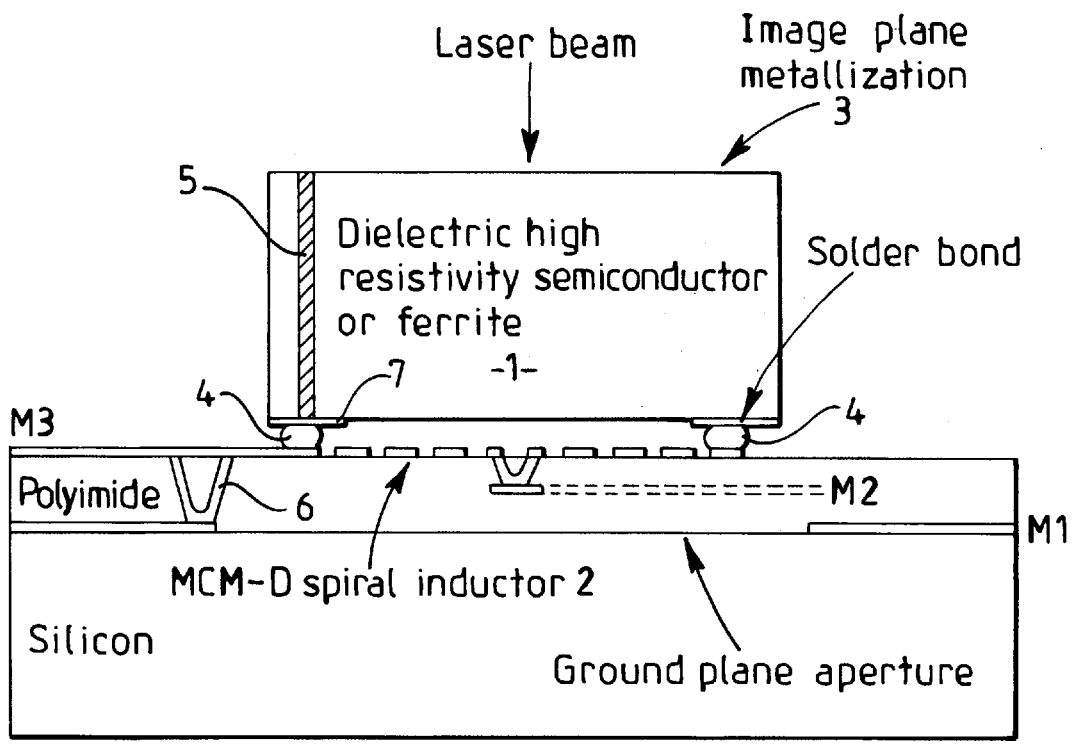
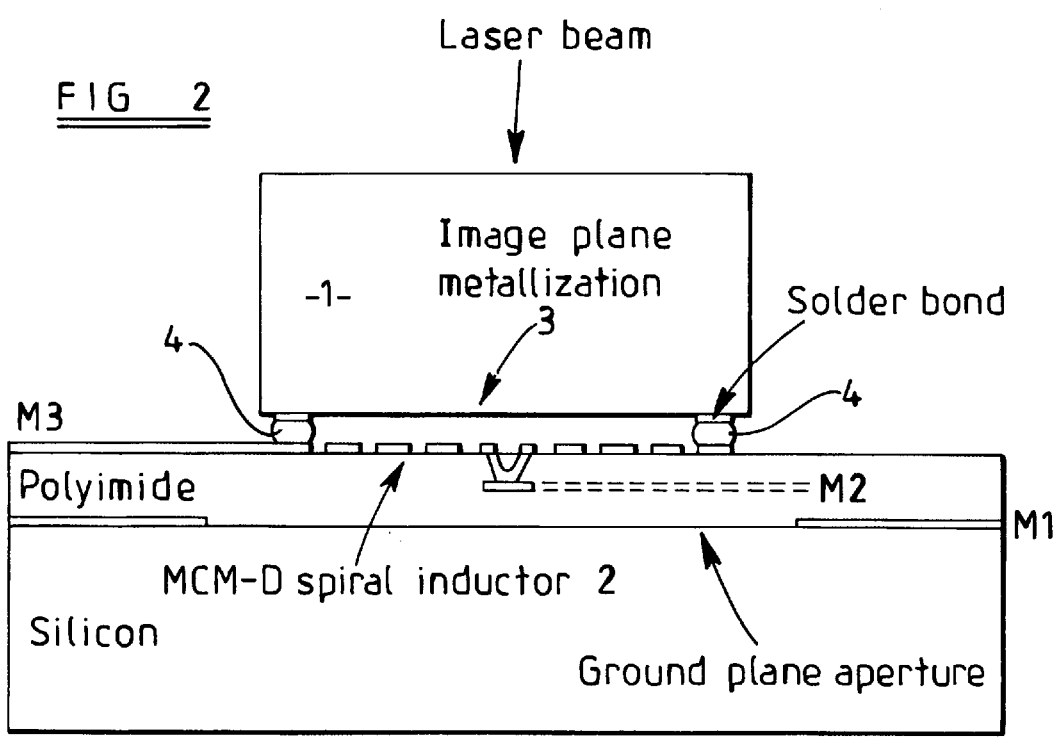

TRIMMABLE INDUCTOR STRUCTURE

BACKGROUND OF THE INVENTION

Very compact, but non-trimmable inductors may be realized in an integrated form within the upper metallization layers of a multichip module type D (MCM-D) substrate structure. Such inductors can provide inductance values between 1 and 100 nH within a 1 mm square footprint (using single or multilayer spiral structures), with self resonant frequencies between 20 GHz and 500 Mhz. The MCM-D ground plane may be removed from the area below the inductor in order to maximized the inductance and self resonant frequency. Quality factor in these MCM-D inductors is determined by the inductor resistance at low frequencies, while the peak quality factor is related to the nature and dielectric structure of the substrate employed. High resistivity silicon substrates with inductors defined in an aluminium-polyimide structure can provide quality factors between about 5 and 20, depending upon the inductor structure and inductance value. The peak quality factor occurs at a frequency between 0.25 and 0.5 of the self resonant frequency. Inductors on sapphire or other good dielectric substrates can achieve quality factors up to 30 in the same system, with the peak quality factor occurring at about 0.5 of the self resonant frequency. The effective cost of such inductors is directly related to the cost per unit area of the MCM-D structure, which is currently about 20 cents per square mm and will fall to 5 to 10 cents per square mm as production volumes rise.

United Kingdom Patent Application No. 9411107.7, corresponding to U.S. Ser. No. 08/463,311, filed Jun. 2, 1995, now abandoned, describes the construction of small, accurate discrete inductors that are to be assembled by flip chip solder bonding for use in multichip module (MCM), direct chip attach (DCA) and surface mount (SM) assemblies. These discrete inductors employ a spiral inductor structure defined in a low resistance copper metallization layer on the upper surface of a small dielectric chip. Metallic vias are included to make connections between the spiral structure on the upper surface and solder bond connections on the lower surface.

United Kingdom Patent Application No. 9413145.5, now U.S. Pat. No. 5,747,870, describes the use of a ferrite chip located over a spiral inductor defined in an MCM-D substrate that acts as a core to increase the specific inductance value or the quality factor of the inductor. The ferrite chip is aligned and supported over the inductor by flip chip solder bonding.

SUMMARY OF THE INVENTION

According to the present invention a trimmable inductor structure for a multichip module, a direct-chip-attach assembly or a surface mount assembly comprises an inductive element formed in said module or assembly and a substantially planar substrate of electrically insulating material having on one major face thereof a trimmable metallization layer, said planar substrate being secured with respect to said module or assembly so as to be inductively coupled with said inductive element.

Preferably said planar substrate is mounted on said module or assembly by means of a plurality of solder bumps.

BRIEF DESCRIPTION OF THE DRAWING

Trimmable inductor structures in accordance with the present invention will now be described by way of example with reference to the accompanying FIGS. 1 and 2 which show the structures diagrammatically in cross-section and FIGS. 3a, 3b and 3c which show various metallization patterns of the structures of FIGS. 1 and 2.

DETAILED DESCRIPTION OF THE PREFERRED EMBODIMENTS

Referring to FIG. 1 the inductor structure comprises a chip 1 of a dielectric, high resistivity semiconductor or ferrite material that is mounted over the area of the MCM-D substrate inductor 2 by flip chip solder bonding. A metallization layer 3 is defined on the upper surface of the chip 1 which gives rise to an image inductance that acts to reduce the primary inductance of the MCM-D inductor 2. The level of inductance reduction depends upon the separation of the layer 3 from the inductor 2 and the permeability of the material of the chip 1. The local removal and/or patterning of this exposed and accessible layer 3, for example by using a laser beam or other focussed energy source, can then be used to adjust the effective overall inductance of the inductor device.

Figure 3A:
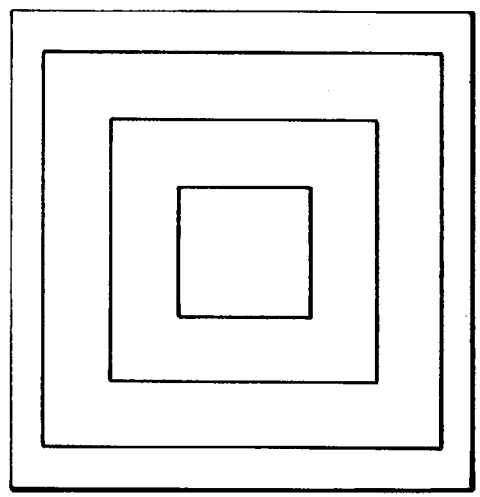
Figure 3B:
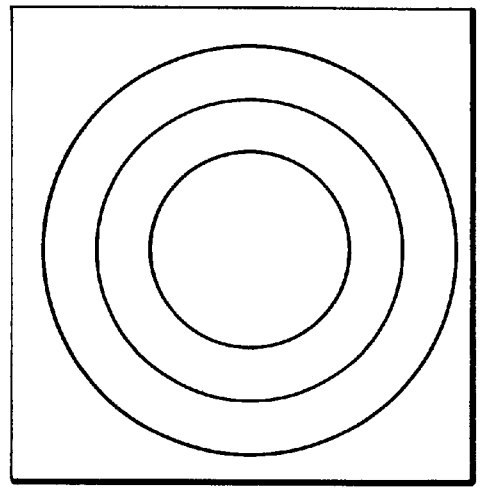
Figure 3C:
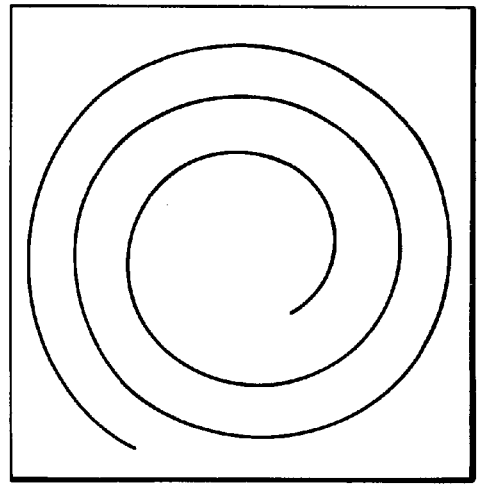

Suitable patterning structures include concentric square or circular ring patterns and spiral structures as shown in FIGS. 3a, 3b and 3c. Concentric ring structures provide image eddy currents that can further reduce the effective inductance in step wise manner according to the number, dimensions and location of the rings with respect to the turns of the primary inductor 2. The concentric ring structures may then be cut to interrupt the individual eddy currents to provide a step wise trimming action that increases the inductance. On the other hand, the effective inductance variation resulting from the use of the spiral trimming action is continuous. Trimming of such inductors may be used to tune oscillator, filter or resonator circuits.

The upper surface metallization layer 3 may be earthed by means of through-chip and MCM-D substrate vias 5 and 6 respectively if required. The separation of the upper metallization layer 3 from the inductor 2, the chip to inductor gap determined by the flip chip solder bond height and the relative permittivity of the chip dielectric material will also determine the additional capacitance of this structure and the influence on the inductor self resonant frequency. For this reason low permittivity materials such as fused quartz may be preferred as the chip material.

A suitable process for fabricating the flip chip structure involves the processing of wafers of the chip material, followed by dicing out of the individual chip components. Since the chip components have a very simple structure, the costs of fabricating them in wafer form will be extremely low.

A wafer of the selected chip material is polished on both faces to provide a suitable surface quality for subsequent processing and use. If the material employed is a ferrite then an annealing treatment may be required after polishing to restore the original magnetic properties. An array of solder bump structures 4 is then defined over one face of the wafer to define the base of the chip 1. These solder bumps 4 will provide mechanical location and support and will physically separate the diced and bonded chip 1 from the MCM-D substrate surface. Corresponding solderable metallization areas and/or solder bumps are defined on the MCM-D substrate itself.

The solder bump structure requires a solderable metallization layer 7 to which the solder bump itself is wetted and which defines the area of the solder bump. Chromium-copper or chromium-copper-gold multilayer metallization structures are suitable for this solderable metallization requirement. The first chromium layer provides adhesion to the underlying chip surface, while an alloyed chromium-copper layer follows that provides solderability without layer dissolution (for multiple solder bump melting operations). The final copper or copper-plus-gold layers provide initial solderability, these metals dissolving into the solder on bump reflow and reprecipitating on cooling as intermetallic compounds of tin. The gold, if employed, allows the solderable layer to be exposed to the atmosphere without oxidation prior to solder deposition. Solderable metallization layers of this type may be defined by sequential vapor deposition through an etched metal foil or similar physical masking structure.

The solder itself may be a tin-lead eutectic composition (63n-37Pb by wt.—melting point 183° C.), but is normally a 95Pb-5Sn composition (melting point 310° C.) for MCM-D applications. The solder may be applied by electrodeposition using a seed layer and photoresist masking scheme. Alternatively a physical masking structure may be employed with a vapor deposition process similar to that described for the solderable metallization deposition. The solder may be deposited as separate layers of lead and tin or as an alloy.

After deposition and patterning of the solderable metallization and solder layers, the solder bumps are reflowed by heating to above the solder liquidus temperature under inert or reducing atmosphere conditions. Solder bump diameters between 50 and 125 micrometers are considered appropriate for the flip chip structure. Bump heights between 30 and 100 micrometers are suitable. Such bump geometries are also typical for flip chip solder bonded integrated circiuts. A typical flip chip structure would employ four corner bumps for mechanical support. A preferred flip chip size would be 0.5, 1.0, 1.25, 1.5 or 2.0 mm on a side.

The inductor image metallization layer 3 is then defined on the opposite surface of the flip chip component wafer to allow laser trimming of MCM-D inductor after dicing and mounting of the flip chip structure. This layer 3 may employ a variety of metallization materials, including, for example, titanium, chromium or aluminium or some combination of such materials. No lithographic or other patterning of this layer is required at the wafer fabrication stage and indeed this layer may be deposited, for example, by sputter deposition, prior to the processing of the flip chip solder bond face. The optical reflectivity and electrical resistivity of this layer will determine the ease of laser trimming and the losses in the inductor image plane.

After processing the wafer may be inspected and the individual flip chip components separated by mechanical sawing or laser scribing.

As shown in FIG. 2, where the substrate material of the chip 1 is optically transparent, the metallization layer 3 may be formed on the face of the substrate of the chip 1 adjacent the module or assembly.

I claim:

1. A trimmable inductor structure, comprising:

a) a first substrate part having an inductor element formed on an upper face thereof, the inductor element having an inductance value;

b) a second substrate part mounted on the first substrate part and overlying the inductor element, the second substrate part having opposite, upper and lower surfaces; and c) a metallization layer on one of said surfaces and being inductively coupled to the inductor element, the metallization layer being selectively removable from said one of the surfaces to alter the inductance value of the inductor element.

2. The inductor structure in accordance with claim 1, wherein the first substrate part is a multichip module, type D substrate.

3. The inductor structure in accordance with claim 1, wherein the metallization layer has a spiral pattern.

4. The inductor structure in accordance with claim 1, wherein the second substrate part is a generally planar substrate constituted of a dielectric material.

5. The inductor structure in accordance with claim 1, wherein the second substrate part is a generally planar substrate constituted of high resistivity semiconductor material.

6. The inductor structure in accordance with claim 1, wherein the second substrate part is a generally planar substrate constituted of ferrite material.

7. The inductor structure in accordance with claim 1, wherein said one of the surfaces is the upper surface of the second substrate part.

8. The inductor structure in accordance with claim 1, wherein the inductor element has a spiral pattern on said one of the surfaces.

9. The inductor structure in accordance with claim 1, wherein the inductor element has a concentric square pattern on said one of the surfaces.

10. The inductor structure in accordance with claim 1, wherein the inductor element has a concentric circular pattern on said one of the surfaces.

11. The inductor structure in accordance with claim 1, wherein said one of the surfaces is the lower surface of the second substrate part, and wherein the second substrate part is constituted of an optically transparent material.

12. The inductor structure in accordance with claim 1, wherein the second substrate part is elevated relative to the first substrate part by a plurality of solder bumps located between the parts.

\* \* \* \* \*